(12) United States Patent
Phillips et al.

(10) Patent No.: US 8,794,011 B2
(45) Date of Patent: Aug. 5, 2014

(54) METHOD AND APPARATUS FOR UTILIZING IN-SITU MEASUREMENTS TECHNIQUES IN CONJUNCTION WITH THERMOELECTRIC CHIPS (TECS)

(75) Inventors: Alton H. Phillips, East Palo Alto, CA (US); Akio Ohta, Saitama (JP); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 407 days.

(21) Appl. No.: 13/270,522

(22) Filed: Oct. 11, 2011

(65) Prior Publication Data

US 2012/0090332 A1   Apr. 19, 2012

Related U.S. Application Data

(60) Provisional application No. 61/393,786, filed on Oct. 15, 2010, provisional application No. 61/470,223, filed on Mar. 31, 2011.

(51) Int. Cl.
*F25B 21/02* (2006.01)

(52) U.S. Cl.
USPC .......................................................... 62/3.2

(58) Field of Classification Search
USPC .................... 62/3.2, 3.3, 3.7, 259.2
See application file for complete search history.

(56) References Cited

U.S. PATENT DOCUMENTS

| | | |
|---|---|---|
| 3,161,542 A | 12/1964 | Ames et al. |
| 3,715,923 A * | 2/1973 | Hornbaker et al. ........... 374/134 |
| 5,581,324 A | 12/1996 | Miyai et al. |
| 5,680,428 A | 10/1997 | Amemiya et al. |
| 6,098,408 A | 8/2000 | Levinson et al. |
| 6,342,941 B1 | 1/2002 | Nei et al. |
| 6,440,619 B1 | 8/2002 | Feldman |
| 6,445,439 B1 | 9/2002 | McCullough |
| 6,455,821 B1 | 9/2002 | Stumbo |
| 6,645,701 B1 | 11/2003 | Ota et al. |
| 6,654,660 B1 | 11/2003 | Singh et al. |
| 6,809,888 B1 | 10/2004 | Markle |
| 7,025,280 B2 | 4/2006 | Kaushal et al. |
| 7,105,836 B2 | 9/2006 | del Puerto et al. |
| 7,212,474 B2 | 5/2007 | Van Helvoirt et al. |
| 7,323,698 B2 | 1/2008 | Sogard |
| 7,359,029 B2 | 4/2008 | Finders et al. |
| 7,362,415 B2 | 4/2008 | Franken et al. |
| 8,028,531 B2 | 10/2011 | Phan et al. |
| 2003/0016338 A1 | 1/2003 | Yasuda et al. |
| 2005/0167514 A1 | 8/2005 | Kaushal et al. |
| 2010/0186942 A1 | 7/2010 | Phillips et al. |
| 2012/0120379 A1 | 5/2012 | Phillips et al. |

\* cited by examiner

*Primary Examiner* — Melvin Jones

(57) ABSTRACT

According to one aspect of the present invention, an apparatus includes a surface and a first array. The surface emits radiation, and the first array is arranged over the surface and arranged to provide cooling to the surface, the first array including a plurality of TECs. At least a first sensing arrangement is substantially integrated with the first array, wherein the first sensing arrangement is arranged to make a non-contact measurement associated with the surface. The apparatus also includes a controller arranged to obtain the non-contact measurement and to use the non-contact measurement to control the cooling provided by the first array.

29 Claims, 12 Drawing Sheets

SECTION A-A

SECTION A-A

METHOD AND APPARATUS FOR UTILIZING IN-SITU MEASUREMENTS TECHNIQUES IN CONJUNCTION WITH THERMOELECTRIC CHIPS (TECS)

CROSS REFERENCE TO RELATED APPLICATION

The present application claims benefit under 35 U.S.C. §119(e) of U.S. Provisional Patent Application No. 61/393,786, entitled "Reticle Cooling Device With Integrated Infrared (IR) Sensors," filed Oct. 15, 2010, and U.S. Provisional Patent Application No. 61/470,223, entitled "Gas Film Thickness Measurement Device," filed Mar. 31, 2011, which are each incorporated herein by reference in their entireties. The present invention is related to U.S. patent application Ser. No. 12/643,932, entitled "Reticle Error Reduction by Cooling," filed Dec. 21, 2009, and U.S. patent application Ser. No. 13/090,183, filed Apr. 19, 2011, which are each incorporated herein by reference in their entireties.

BACKGROUND OF THE INVENTION

1. Field of the Invention

The present invention relates generally to equipment used in semiconductor processing. More particularly, the present invention relates to non-contact, in-situ methods of making measurements during semiconductor processing.

2. Description of the Related Art

In the presence of heat, reticles have a tendency to distort. The accuracy with which processes that utilize the reticles are performed is compromised when reticles are distorted. By way of example, the accuracy of masking and/or patterning processes which use reticles may be compromised.

To cool a reticle, a heat exchanger that includes an array of thermoelectric chips (TECs) may be used to carry heat away from the reticle. In order to determine how much heat to remove from the reticle, the surface temperatures of the reticle may be obtained using infrared (IR) radiation sensors. Typically, measuring the temperatures involves substantially separating the TECs from the reticle, e.g., removing the reticle out from underneath the TECs, placing the reticle in the vicinity of a sensor such as an IR sensor, and then measuring the temperature of the reticle. Once the temperature of the reticle is determined, if further cooling of the reticle is desired, the reticle is repositioned underneath the TECs. Ceasing the cooling of a reticle in order to obtain a temperature measurement of the reticle is generally time consuming and, thus, relatively inefficient, particularly when additional cooling may be required.

An air gap generally exists between a TEC, e.g., a TEC of a TEC array, a reticle that underlies the reticle. The air gap generally corresponds to a film of gas between the reticle and the TEC array. In order for a reticle temperature controller to accurately prescribe TEC temperatures within a single exposure-cooling cycle such that a target reticle temperature may be achieved at a pre-determined time in the future, knowledge of the size of an air gap is generally necessary. If the size, e.g., height, of the air gap is not maintained, as the air gap has a relatively high associated thermal resistance, heat conduction within the air gap may not be accurately determined. As a result, the target temperature of a reticle may not be achieved in a single exposure-cooling cycle. Thus, without foreknowledge as to the actual height of an air gap and/or the ability to maintain the height of the air gap, controlling the temperature of the reticle may be difficult in a single exposure-cooling cycle.

SUMMARY

The present invention pertains to performing in-situ measurements relating to the temperature of a surface of a reticle without contacting the surface of the reticle. When non-contact measurements regarding the temperature of a reticle may be obtained while the reticle is being cooled by a thermoelectric chip (TEC) or, more generally, when a reticle is situated substantially beneath a TEC, a cooling process may be more efficient and the accuracy with which the temperature of the reticle is controlled may improve.

In one embodiment, infrared (IR) radiation sensors and/or IR cameras may be substantially integrated with a TEC array such that temperature measurements may be made in-situ with respect to a reticle. In another embodiment, a dual flux sensor and a zoned buffer plate may cooperate to enable the height of an air gap between a TEC and a reticle to be determined and to make in-situ reticle temperature measurements, thereby allowing the temperature of the reticle to be accurately measured in-situ and controlled.

According to one aspect of the present invention, an apparatus includes a first array, the first array being arranged over a surface and arranged to provide cooling to the surface, the first array including a plurality of TECs. The surface is arranged to emit radiation. At least a first sensing arrangement is substantially integrated with the first array, wherein the first sensing arrangement is arranged to make a non-contact measurement associated with the surface. The apparatus also includes a controller arranged to obtain the non-contact measurement and to use the non-contact measurement to control the cooling provided by the first array.

According to another aspect of the present invention, an apparatus includes a surface, a first array, and an IR sensing arrangement. The surface emits radiation, and the first array is arranged over the surface and arranged to provide cooling to the surface. The first array includes a plurality of TECs arranged in the first array such that at least one space is defined by the plurality of TEC. The IR radiation sensing arrangement detects the radiation when the radiation emanates from the surface to the at least one space. The controller obtains information associated with the radiation detected by the IR radiation sensing arrangement, and uses the information to control the cooling provided by the first array. In one embodiment, the IR radiation sensing arrangement includes at least one IR camera positioned above the first array. In another embodiment, the IR radiation sensing arrangement includes a plurality of IR sensors.

According to still another aspect of the present invention, an apparatus includes a first TEC, a flux sensor arrangement, and a buffer plate. The flux sensor arrangement is coupled to the first TEC. The buffer plate is positioned such that a portion of the buffer plate is at a first distance over an underlying reticle. The buffer plate and the flux sensor arrangement cooperate to determine the first distance.

In accordance with yet another aspect of the present invention, a method of cooling a reticle includes providing an amount of cooling to the reticle using a plurality of TECs positioned above the reticle, the plurality of TECs being arranged in an array such that a first TEC of the plurality of TECs is separated from a second TEC of the plurality of TECs by a first space. The method also includes sensing IR radiation emitted from the reticle, wherein the IR radiation emitted from the reticle is sensed using an IR sensing arrangement configured to sense the IR radiation through the first space. Finally, the method includes adjusting the amount of cooling based on the sensed IR radiation.

According to yet another aspect of the present invention, a method of identifying a height of an air gap between a reticle and a cooling arrangement that includes a TEC, a flux sensor arrangement, and a zoned buffer plate includes identifying a height associated with the buffer plate. The method also includes measuring a first voltage associated with a first zone of the zoned buffer plate and a second voltage associated with a second zone of the zoned buffer plate using the flux sensor arrangement. Utilizing the height associated with the buffer plate, information associated with the first voltage, and information associated with the second voltage, the height of the air gap may be calculated.

BRIEF DESCRIPTION OF THE DRAWINGS

The invention will be readily understood by the following detailed description in conjunction with the accompanying drawings, in which.

DETAILED DESCRIPTION OF THE EMBODIMENTS

Figure 1A:
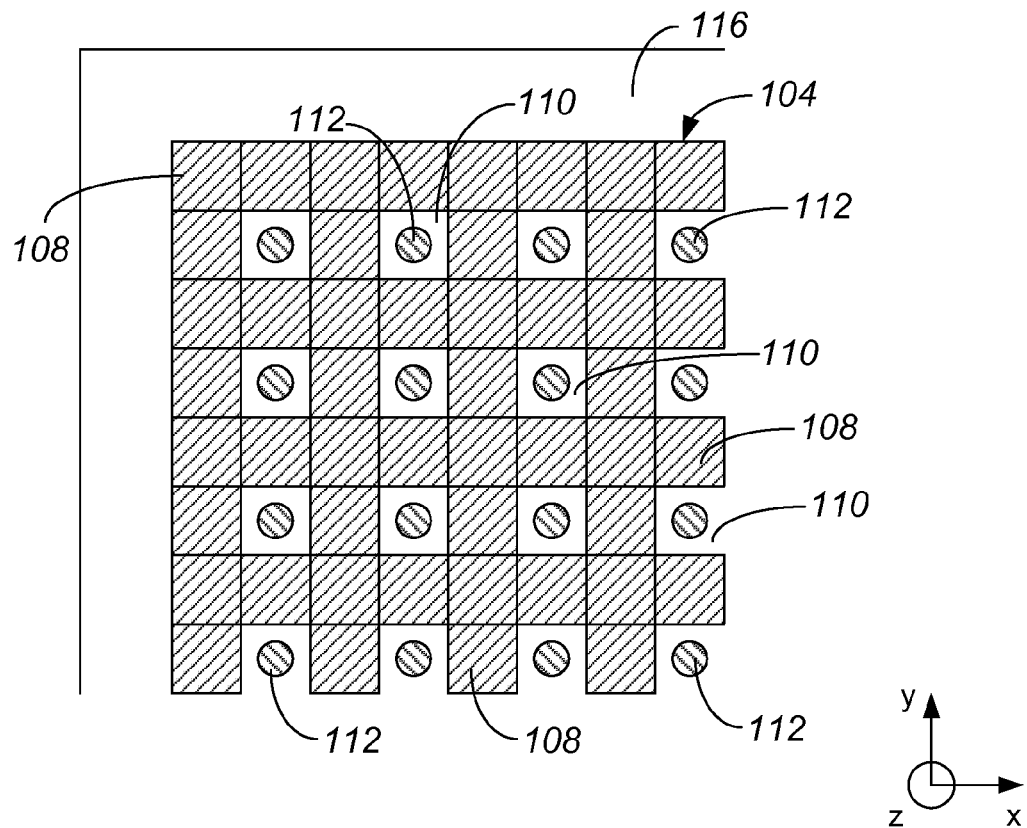
FIG. 1A is a diagrammatic top-view representation of a portion of a top of a first thermoelectric chip (TEC) array with infrared (IR) sensors substantially integrated with the TEC array in accordance with an embodiment of the present invention.

Example embodiments are discussed below with reference to the various figures. However, those skilled in the art will readily appreciate that the detailed description given herein with respect to these figures is for explanatory purposes, as the invention extends beyond these embodiments.

By enabling measurements to be taken with respect to a reticle surface during a heat transfer operation, e.g., a cooling operation, without contacting the reticle surface, accurate measurements may be made substantially without disrupting the heat transfer operation. In other words, enabling in-situ measurements to be made during a cooling process allows the cooling process to be efficiently adjusted, as appropriate, based upon the measurements. It should be appreciated that the cooling of a reticle, or "reticle cooling," generally refers to net heat carried away from a reticle, e.g., by a thermoelectric chip (TEC). In addition, depending on a target reticle temperature field, a TEC may either add heat to a reticle or remove heat from the reticle.

Sensors may be integrated with a cooling device to effectively make non-contact measurements of a reticle surface during a heat transfer operation such as a cooling operation. Such sensors may generally include, but are not limited to including, IR sensors arranged to measure IR radiation that emanates from a reticle surface and flux sensors that are arranged to measure temperatures associated with the reticle surface. In a first embodiment, IR sensors may interspersed between thermoelectric chips (TECs) of a TEC array or an IR camera may be located behind a TEC array to capture radiation emanating from an underlying reticle surface without contacting the reticle surface. In a second embodiment, flux sensors may be co-located with TECs in a TEC array to measure a temperature of a reticle surface without contacting the reticle surface.

TECs may be used to provide cooling to a surface of a reticle, e.g., a top side or surface of a reticle. When a top side of a reticle is within a particular distance from a TEC, heat may be transferred from the top side of the reticle to the TEC. TECs may generally include thermoelectric coolers and thermoelectric modules. The ability to measure the surface temperature of a reticle while the reticle is being cooled by TECs increases the efficiency with which the reticle is being cooled. For example, more cooling may be provided if needed, and cooling may be ceased substantially as soon as the measured temperature indicates that the reticle has been cooled to a desired temperature. In a first embodiment, by substantially integrating IR sensors with, e.g., into, a TEC array, less space within an overall system is essentially needed to accommodate the IR sensors. In addition, when IR sensors are substantially integrated with a TEC array, the IR sensors may more efficiently measure the surface temperatures of an underlying reticle, as the surface temperatures may be measured in-situ, and substantially without contacting the surface of the underlying reticle. The number of IR sensors used to measure surface temperatures of an underlying reticle may vary depending, for example, upon the size of the reticle. The temperatures of the surface of the reticle may be read by the IR sensors while the TEC array is cooling the reticle, thereby reducing the total amount of time needed to measure and to cool the reticle. The surface temperature of a reticle may also be measured during a cooling process by an IR sensing camera positioned substantially over a TEC array in which there are openings, e.g., locations in which the TEC array has effectively replaced a TEC with an empty space. Any number of IR sensing cameras may be used to measure the surface temperature of a reticle during a cooling process.

In a second embodiment, a heat flux sensor may also be used to measure the temperature of the surface of an underlying reticle without contacting the surface of the reticle. For example, to determine the temperature of a portion of a surface of a reticle, a TEC that is positioned substantially over the portion of the surface may effectively utilize at least one associated heat flux sensor. An associated heat flux sensor may be substantially directly coupled to a TEC. Because an air gap between a heat flux sensor and an underlying reticle has a relatively high thermal resistance, to increase the accuracy with which the heat flux sensor may measure the temperature of the surface of the reticle, knowledge regarding characteristics of the air gap is obtained such that a change in the size of the air gap may be accounted for when measuring temperature with a heat flux sensor. In one embodiment, a dual heat flux sensor and a buffer plate are used to detect changes in the height of an air gap to improve the precision with which the temperature of the surface of the reticle that underlies the dual heat flux sensor and the buffer plate or, more generally, a state of the reticle, may be estimated. It should be appreciated that each TEC of a TEC array may include a dual heat flux sensor and a buffer plate. In addition, it should be understood that utilizing a flux sensor to measure temperature generally entails using the flux sensor in conjunction with a temperature measurement sensor, e.g., a thermistor.

A first embodiment that utilizes sensors integrated with a TEC array to make non-contact temperature measurements of a reticle surface during a cooling process will be described with respect to FIGS. 1A through 6B. Referring initially to FIG. 1A, a first TEC array with IR sensors substantially integrated with the first TEC array will be described in accordance with an embodiment of the present invention. A first TEC array 104 includes multiple TECs 108, and is arranged over a reticle 116. Typically, TECs 108 are separated from reticle 116 by an air gap. For ease of illustration, a portion of first TEC array 104 and a portion of reticle 116 are shown. First TEC array 104 is arranged such that some TECs 108 are substantially adjacent to spaces 110 defined within first TEC array 104. Spaces 110 are generally sized to have approximately the same dimensions as TECs 108. It should be appreciated that spaces 110 may generally correspond to locations within first TEC array 104 from which TECs have been removed.

In general, the size of first TEC array 104 may vary widely depending upon factors including, but not limited to including, the requirements of a particular photolithography apparatus of which first TEC array 104 is a part. For example, the number of TECs 108 included in first TEC array 104 and the number of spaces 110 defined within first TEC array 104 may vary widely. In one embodiment, first TEC array 104 may be sized to accommodate a total of up approximately 221 TECs, but may include approximately 167 TECs 108 and approximately 54 spaces 110. While the ratio of TECs 108 to IR sensors 112 may vary, the ratio is preferably a minimum of approximately 1:1.

Sensors 112 that are arranged to sense IR radiation, e.g., IR sensors, emitted from reticle 116 may be positioned over spaces 110. Thus, IR sensors 112 may be arranged in an array that substantially overlies first TEC array 104. In the embodiment as shown, the array of IR sensors 112 is such that IR sensors 112 are approximately centered over spaces 110, and such that the faces of IR sensors 112 are behind TECs 108 relative to a z-axis. Using IR sensors 112, IR radiation emitted from reticle 116 is detected such that the surface temperature associated with areas of reticle 116 may effectively be measured. Typically, each IR sensor 112 may measure the surface temperature associated with a discrete area on the surface of reticle 116.

IR sensors 112 may generally be any suitable IR sensors. Suitable IR sensors include, but are not limited to including, the Melexis 90614 sensor available from Melexis microelectronic Systems of Ieper, Belgium and the Exergen irt/c sensor available from Exergen Corporation of Watertown, Mass.

Although each space 110 is shown as having an IR sensor 112 positioned therein, it should be appreciated that some spaces 110 may remain substantially empty. In one embodiment, spaces 110 are located within first TEC array 104 such that when IR sensors 112 is located in approximately every space 110, a significant amount of IR radiation emitted from reticle 116 may be sensed by IR sensors 112. In other words, the position of IR sensors 112 with respect to TECs 108 may be selected to substantially maximize the amount of IR radiation emitted from reticle 116 that may be detected by IR sensors 112. It should be appreciated that the position and/or number of IR sensors 112 substantially interspersed with TECs 108 may be balanced against the position and/or number of TECs 108 such that a desired performance of TEC array 104 and a desired amount IR radiation detection may be achieved.

Figure 1B:
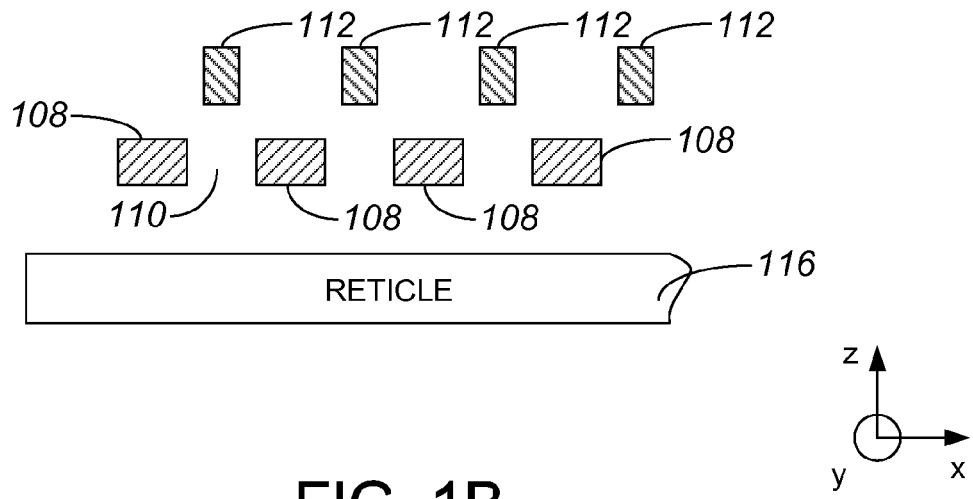
FIG. 1B is a diagrammatic side-view representation of a side of a TEC array, e.g., TEC array 104 of FIG. 1A, with IR sensors substantially integrated with the TEC array in accordance with an embodiment of the present invention.

FIG. 1B is a side-view representation of TEC array 104. In the described embodiment, IR sensors 112 are positioned substantially over TECs 108. It should be appreciated, however, that with respect to a z axis, the position of IR sensors 112 relative to TECs 108 may vary. For example, as will be discussed below with respect to FIG. 4, IR sensors may be arranged such that the IR sensors are effectively in the same plane as the TECs of a TEC array.

Figure 1C:
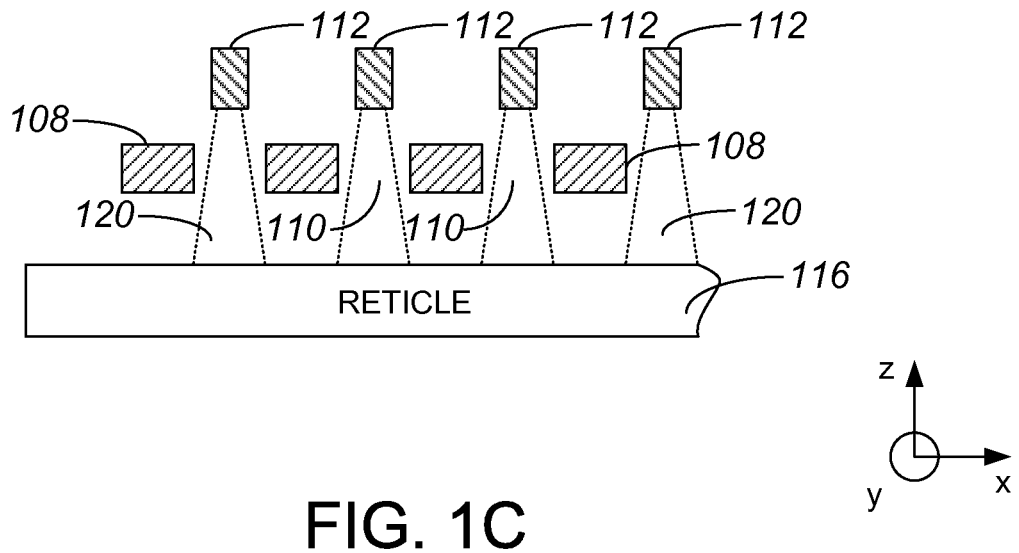
FIG. 1C is a diagrammatic side-view representation of a side of a TEC array, e.g., TEC array 104 of FIG. 1A, with IR sensors substantially integrated with the TEC array, as shown with IR sensing regions, in accordance with an embodiment of the present invention.

Each IR sensor 112 generally has an associated sensing region. That is, each IR sensor 112 is arranged to sense IR radiation emitted from a particular area of reticle 116. As shown in FIG. 1C, each IR sensor 112 is arranged to sense IR radiation emitted from areas of reticle that are effectively exposed by spaces 110 between TECs 108.

Figure 2:
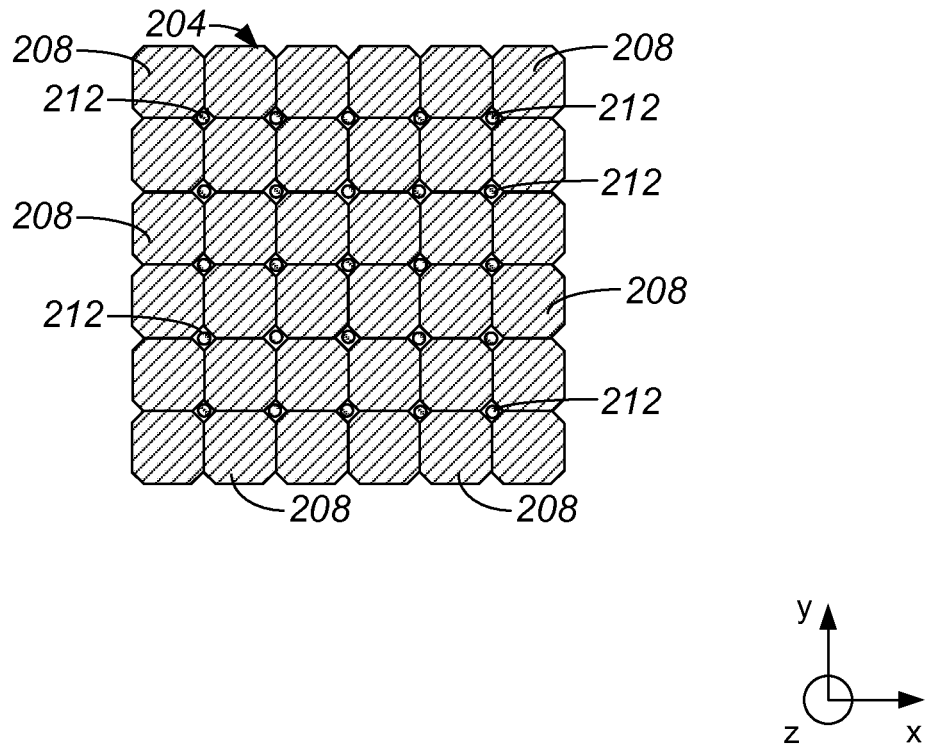
FIG. 2 is a diagrammatic top-view representation of a portion of a top of a second TEC array with IR sensors substantially integrated with the TEC array in accordance with an embodiment of the present invention.

Although a TEC array such as TEC array 104 may be configured such that there are spaces 110 which are approximately the same size as TECs 108, a TEC array may include spaces that are much smaller. For example, edges of TECs 108 may be shaped such that IR sensors may be placed substantially at intersections of approximately adjacent TECs 108 within a TEC array. FIG. 2 is a diagrammatic top-view representation of a portion of a top of a TEC array with IR sensors substantially integrated with the TEC array such that the IR sensors are located near corner areas of substantially adjacent TECs relative to an xy-plane in accordance with an embodiment of the present invention. A TEC array 204 includes TECs 208 that are approximately octagonally shaped. IR sensors 212 are positioned in gaps formed near corner areas of substantially adjacent TECs 208. In contrast to TEC array 104 of FIGS. 1A-C, in which some TECs are effectively replaced by spaces 110 and IR sensors 112, TEC array 204 is such that IR sensors 212 are positioned substantially between TECs 208 without any TECs 208 effectively being replaced by IR sensors 212.

Figure 3A:
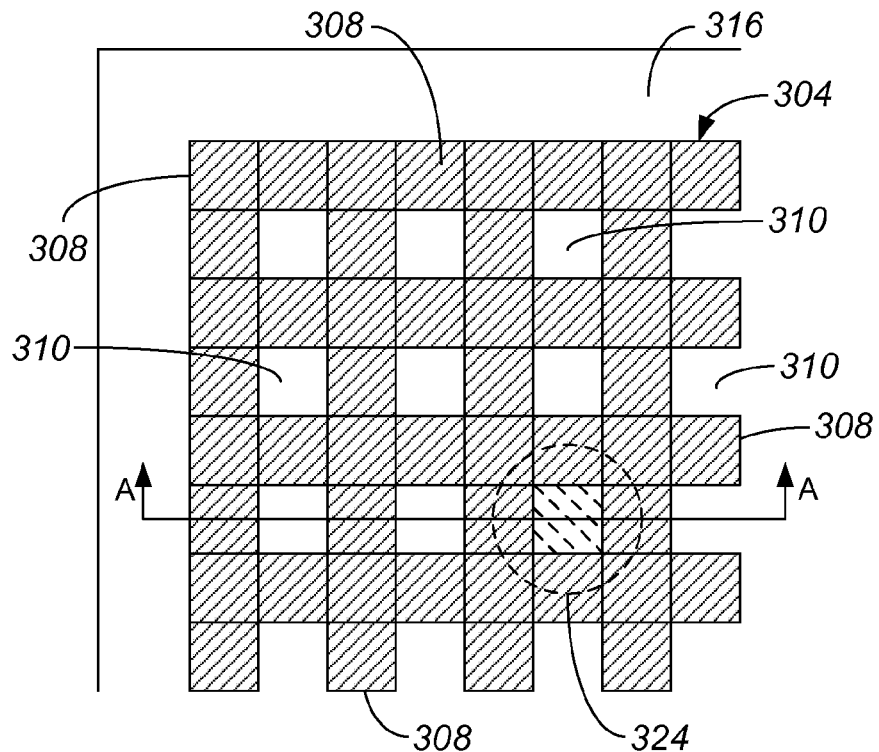
FIG. 3A is a diagrammatic top-view representation of a portion of a top of a TEC array with an IR sensing camera positioned substantially over the top of the TEC array in accordance with an embodiment of the present invention.
Figure 3B:
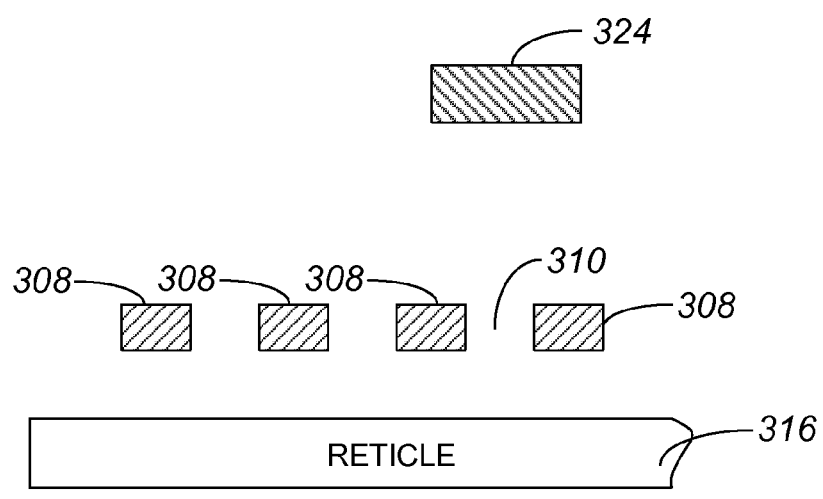
FIG. 3B is a diagrammatic cross-sectional representation of a TEC array, e.g., TEC array 304 of FIG. 3A, with an IR sensing camera positioned substantially over the top of the TEC array in accordance with an embodiment of the present invention.

In lieu of using IR sensors to sense or to detect radiation emitted by a reticle, an IR sensing camera may instead be used to sense or to detect the radiation. FIG. 3A is a diagrammatic top-view representation of a portion of a top of a TEC array with an IR sensing camera positioned substantially over the top of the TEC array, and FIG. 3B is represents a cross-section of the TEC array taken through an axis A-A in accordance with an embodiment of the present invention. A TEC array 304 includes multiple TECs 308, and is arranged over a reticle 316. For ease of illustration, a portion of TEC array 304 and a portion of reticle 316 are shown. TEC array 104 is arranged such that some TECs 308 are substantially adjacent to spaces 310 defined within TEC array 304. Spaces 310 are generally sized to have approximately the same dimensions as TECs 308, as spaces 310 may correspond to locations within TEC array 304 from which TECs have been removed.

An IR sensing camera 324 is positioned at a distance substantially above TEC array 304. It should be appreciated that although a single IR sensing camera 324 is shown in FIG. 3A for ease of illustration, any number of IR sensing cameras 324 may generally be used to detect IR radiation emitted by reticle 316 such that the temperature of areas of the surface of reticle 316 may be ascertained. In one embodiment, IR sensing camera 324 is positioned such that IR sensing camera 324 is substantially centered over an opening 310. The distance between IR sensing camera 324 and TEC array 304 may vary depending upon any number of factors including, but not limited to including, the size of IR sensing camera and related lenses 324, and a field-of-view and a resolution associated with IR sensing camera 324.

Figure 3C:
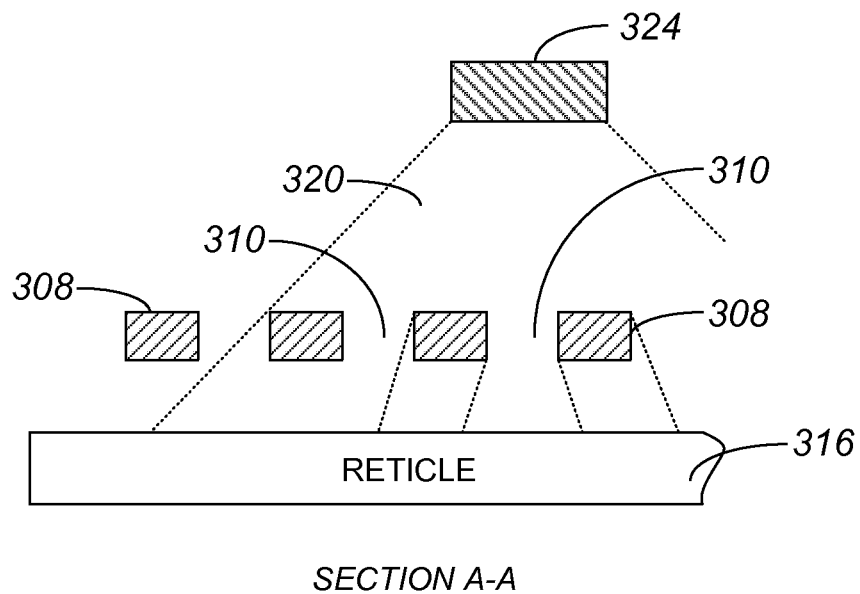
FIG. 3C is a diagrammatic cross-sectional representation of a TEC array, e.g., TEC array 304 of FIG. 3A, with an IR sensing camera positioned substantially over the top of the TEC array, as shown with an IR sensing region in accordance with an embodiment of the present invention.

IR sensing camera 324 has an associated sensing region. With reference to FIG. 3C, a sensing region within which IR sensing camera 324 detects IR radiation emitted by reticle 316 will be described in accordance with an embodiment. IR sensing camera 324 is arranged such a sensing region 320 covers, or otherwise encompasses, multiple spaces 310.

Figure 4:
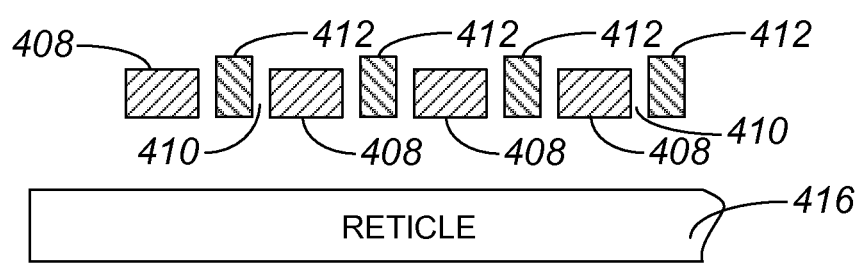
FIG. 4 is a diagrammatic side-view representation of a portion of a TEC array with IR sensors substantially integrated with the TEC array such that the IR sensors are effectively in the same plane as TECs of the TEC array in accordance with an embodiment of the present invention.
Figure 4:
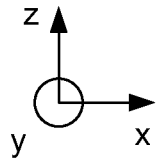

As discussed above with respect to FIGS. 1A-C, IR sensors may be positioned such that sensing faces of the IR sensors are positioned substantially over or above a TEC array. In some instances, positioning sensing faces of IR sensors as close as possible to a cooling plane of a TEC array, i.e., a plane that includes cooling faces of TECs included in a TEC array. For example, if substantially minimizing reflections from TECs in the vicinity of an IR sensor is desired, sensing faces of IR sensors may be positioned as close as possible to cooling faces of TECs. Referring next to FIG. 4, IR sensors which are substantially integrated with a TEC array such that sensing faces of the IR sensors are approximately in the cooling plane of the TEC array will be described in accordance with an embodiment. A TEC array includes TECs 408, which are arranged over a reticle 416. As shown, spaces 410 are defined between TECs 408. Within spaces 410, IR sensors 408 are positioned such that sensing faces of IR sensors 408 are in approximately the same plane as cooling faces of TECs 412, e.g., in an xy-plane.

Figure 5:
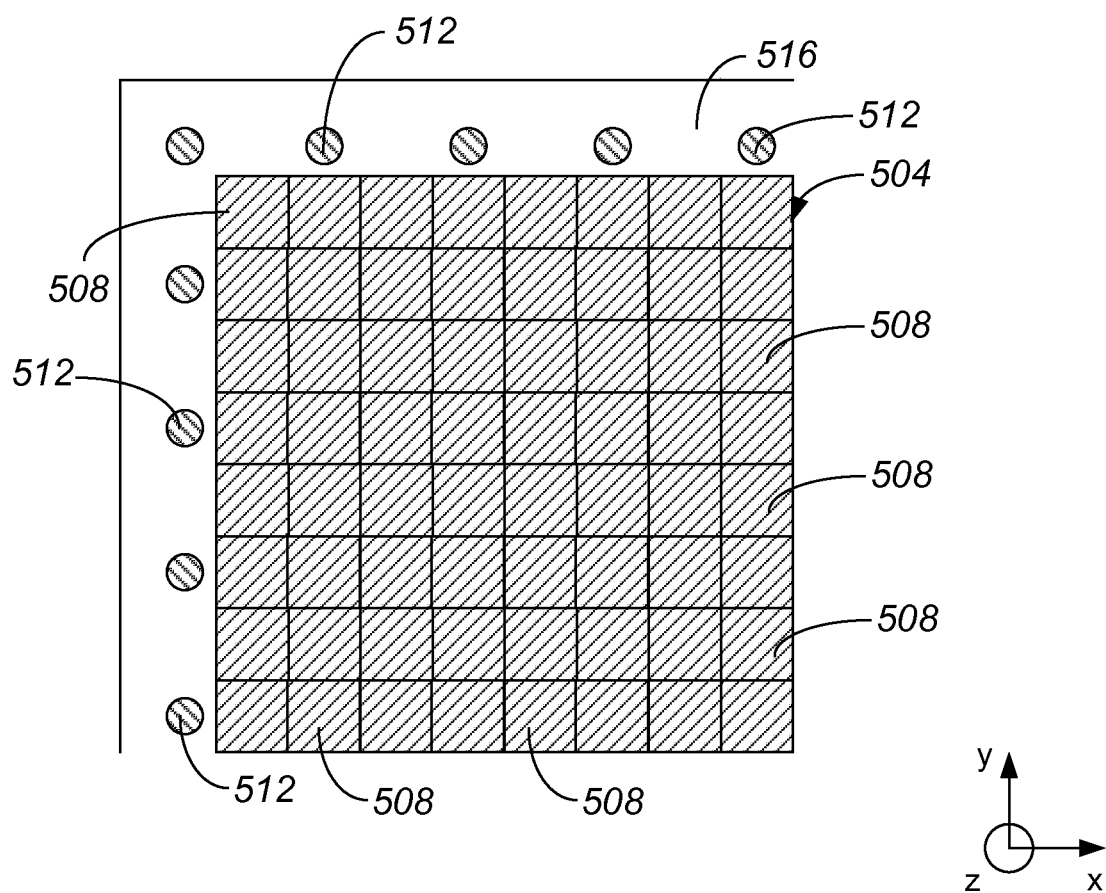
FIG. 5 is a diagrammatic top-view representation of a portion of a TEC array with IR sensors arranged along the periphery of the TEC array in accordance with an embodiment of the present invention.

In one embodiment, rather than effectively integrating IR sensors with a TEC array or utilizing at least one IR sensing camera with a TEC array, an overall system arranged to provide cooling while substantially measuring temperatures of a surface of a reticle at the same time may utilize IR sensors positioned around the periphery of the TEC array. FIG. 5 is a diagrammatic top-view representation of a portion of a TEC array with IR sensors arranged along the periphery of the TEC array in accordance with an embodiment of the present invention. A TEC array 504 that includes TECs 508 is arranged substantially over a reticle 516. Along the periphery of TEC array 504, IR sensors 512 are positioned. In general, the distance between each IR sensor 512 and TEC array 504 may vary widely depending upon any number of factors including, but not limited to including, the requirements of an overall system. IR sensors 512 may be arranged such that sensing faces of the IR sensors 512 are either in the cooling plane of TEC array 504, e.g., in substantially the same xy-plane as TEC array 504, or effectively behind the cooling plane relative to a z-axis.

Figure 6A:
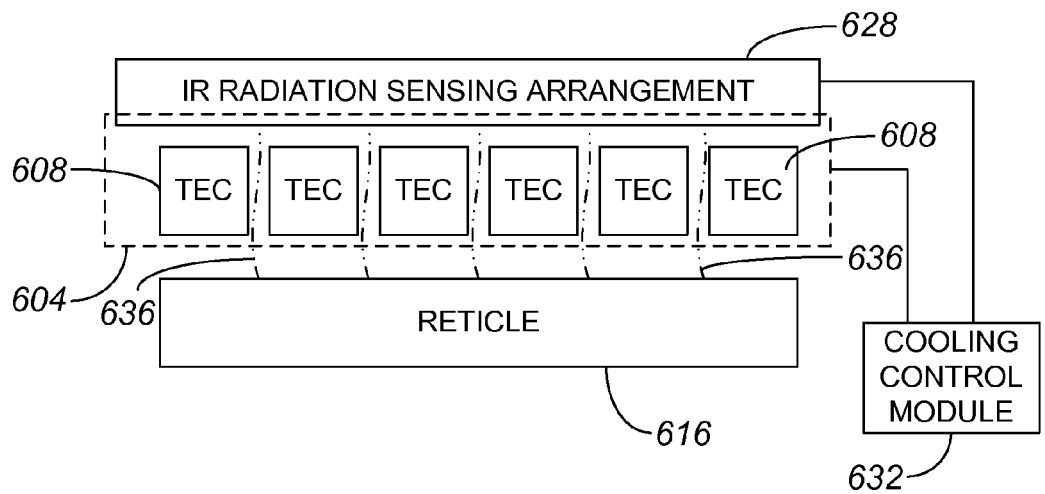
FIG. 6A is a block diagram representation of an IR radiation sensing arrangement that is substantially integrated with a TEC array in accordance with an embodiment of the present invention.

An IR radiation sensing arrangement that includes IR sensors and/or at least one IR sensing camera generally provides information to a controller such that the amount of cooling provided to a reticle may be adjusted as appropriate. By way of example, using information provided by an IR radiation sensing arrangement, a cooling control module may provide information which determines a length of time the TEC array is to be used to cool a reticle to a system that includes the TEC array. FIG. 6A is a block diagram representation of an IR radiation sensing arrangement that is substantially integrated with a TEC array in accordance with an embodiment of the present invention. A TEC array 608 that includes TECs 608 is positioned substantially over a reticle 616 such that IR radiation 636 emitted by reticle 616 may essentially pass into spaces between TECs 608 to IR radiation sensing arrangement 628. IR radiation sensing arrangement 628, which is substantially integrated with TEC array 604, may include a plurality of IR sensors (not shown) and/or at least one IR sensing camera (not shown).

When IR radiation sensing arrangement 628 detects or otherwise obtains IR radiation 636, IR radiation sensing arrangement 628 provides information relating to IR radiation 636, e.g., as temperature readings associated with a top surface of reticle 616, to cooling control module 632. Cooling control module 632 may utilize the information provided by IR radiation sensing arrangement 628 to ascertain whether reticle 616 is sufficiently cooled and/or whether additional cooling is to be provided by TEC array 604. Cooling control module 632 may provide an indication of whether additional cooling is to be provided by TEC array 604 to TEC array 608.

Figure 6B:
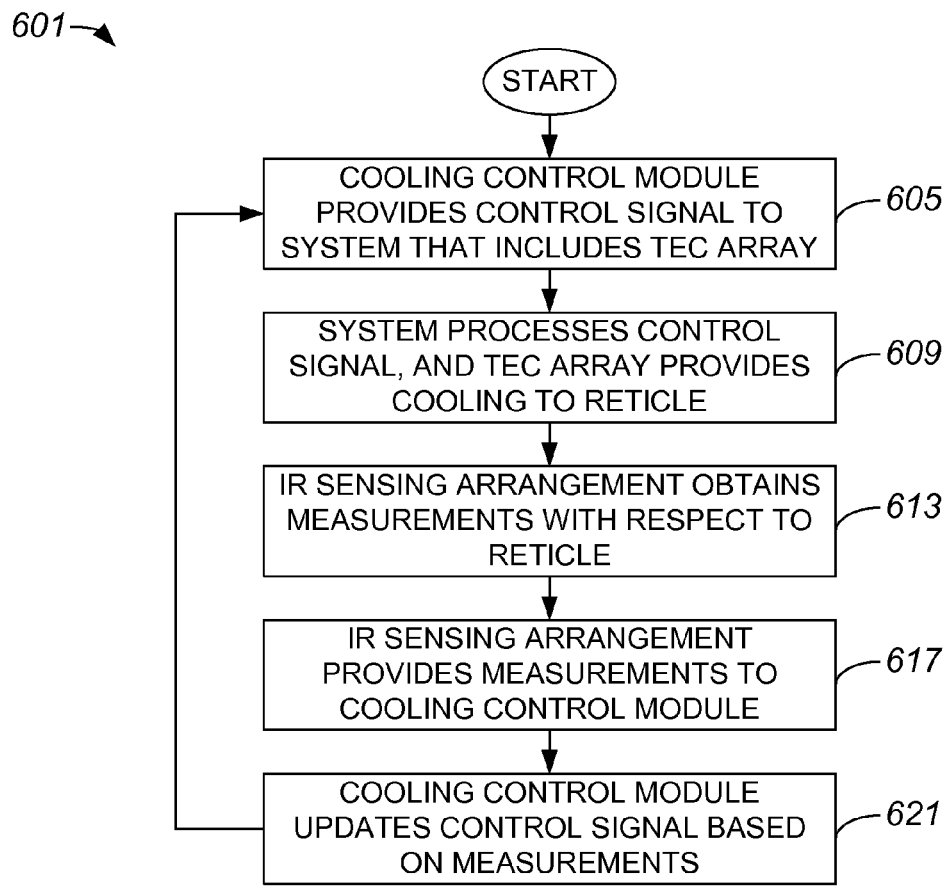
FIG. 6B is a process flow diagram which illustrates a method of using an IR radiation sensing arrangement, e.g., IR radiation sensing arrangement 628 of FIG. 6A, in cooperation with a TEC array to cool a reticle in accordance with an embodiment of the present invention.

Referring next to FIG. 6B, a method of using an IR radiation sensing arrangement, e.g., IR radiation sensing arrangement 628 of FIG. 6A, in cooperation with a TEC array to cool a reticle in accordance with an embodiment of the present invention. A method 601 of cooling a reticle begins at step 605 in which a cooling control module provides a control signal to a system that includes a TEC array. The control signal may be arranged to indicate to the system that the TEC array is to actively provide cooling to a reticle.

After the cooling control module provides a control signal the system processes the control signal, and the TEC array provides cooling to the reticle, in step 609. An IR sensing arrangement obtains measurements with respect to the reticle in step 613. By way of example, the IR sensing arrangement may obtain temperature measurements relating to the reticle by detecting IR radiation emitted by the reticle. Once measurements are obtained with respect to the reticle, the IR sensing arrangement provides the measurements to the cooling control module in step 617. It should be appreciate that the measurements may be provided to the cooling control module while a TEC array is cooling the reticle.

Upon obtaining measurements provided by the IR sensing arrangement, process flow moves from step 617 to step 621 in which the cooling control module updates the control signal. After the control signal is updated, process flow returns to step 605 in which the cooling control module provides the updated control signal to the system. In one embodiment, when the updated control signal indicates that the reticle has been sufficiently cooled, the system may cause the TEC array to cease cooling the reticle.

With reference to FIGS. 7A-7C and FIGS. 11-13, a second embodiment that utilizes a flux sensor arrangement in conjunction with a TEC arrangement to make non-contact temperature measurements of a surface of an underlying reticle will be described. With foreknowledge of a gap distance between a TEC arrangement and a surface of a reticle, a flux sensor may be used to accurately measure the temperature of the surface of the reticle. As mentioned above, a TEC that is a part of a TEC is generally separated from an underlying reticle by an air gap. The height of an air gap may vary. For instance, an air gap may have a height in the range of between approximately 0.1 micrometers (μm) and approximately 50 μm, as for example between approximately 10 μm and approximately 30 μm. When the height of an air gap changes while a reticle is being cooled by a TEC array, the cooling of the reticle may be adversely impacted, as temperature readings taken with respect to the reticle may be inaccurate, thereby potentially resulting in an inadequate amount of cooling. In general, a change in the height of an air gap causes the gas film thickness to vary within the air gap, and causes a change in the heat conduction within the air gap.

Enabling the height of an air gap to be measured at each TEC of a TEC array while an underlying reticle is being cooled allows the height to be determined efficiently, as the need for a separate measurement process is effectively eliminated. Further, obtaining information relating to the height of an air gap at each TEC improves the precision with which a reticle state, e.g., a temperature of a reticle, may be estimated. In other words, identifying the height of the air gap allows the height of the air gap to be accounted for when determining the temperature of the reticle. Given information relating to the height of the air gap. A flux sensor may effectively measure the temperature of the reticle.

Figures 7A, 7B:
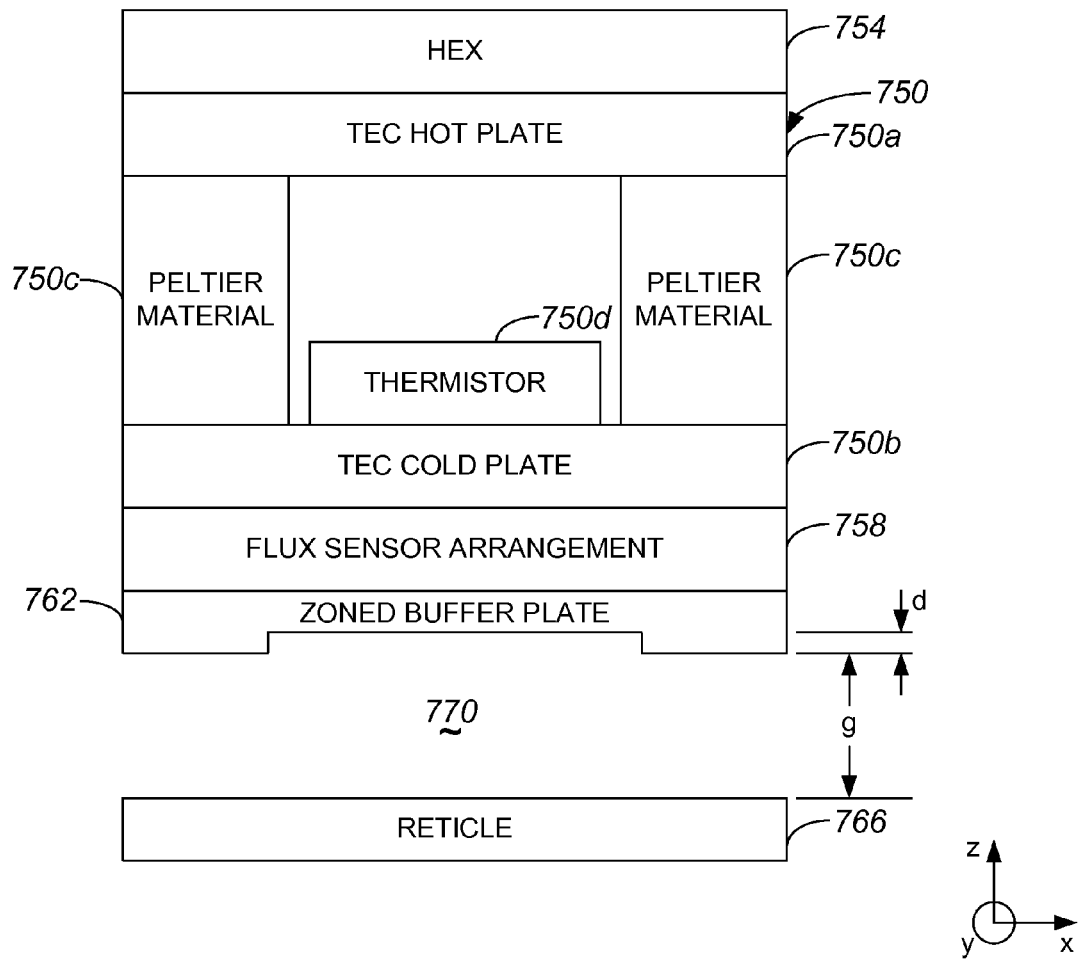
FIG. 7A is a diagrammatic representation of a TEC with an associated flux sensor and an associated zoned buffer plate in accordance with an embodiment of the present invention.
FIG. 7B is a diagrammatic bottom view representation of a zoned buffer plate, e.g., zoned buffer plate 762 of FIG. 7A, in accordance with an embodiment of the present invention.

FIG. 7A is a diagrammatic representation of a TEC with an associated flux sensor, e.g., a flux sensor co-located with respect to the TEC, and an associated zoned buffer plate in accordance with an embodiment of the present invention. A TEC 750, which may be part of an array of TECs (not shown), includes a TEC hot plate 750a, a TEC cold plate 750b, Peltier material 750c, and a thermistor 750d. TEC 750 is effectively coupled to a heat exchanger (HEX) 754 and to a flux sensor arrangement 758. In one embodiment, flux sensor arrangement 758 includes a dual flux sensor. A buffer plate 762 is substantially coupled to flux sensor arrangement 758, and is separated from a reticle 766 by an air gap 770 which has a height g.

Buffer plate 762 is configured to cooperate with flux sensor arrangement 758 to sense height g of air gap 770. In the described embodiment, buffer plate 762 is a zoned buffer plate that has at least one zone. Height g may be measured as a substantially shortest distance between a surface of buffer plate 762 and a top surface of reticle 766. A height d may be a height that corresponds to a difference, e.g., an offset, between a thickness of one zone of buffer plate 762 and a thickness of another zone of buffer plate 762. For example, with reference to FIG. 7B, height d may correspond to a difference between a dimension along a z-axis of first zones 762a of buffer plate 762 and a second zone 762b of buffer plate 762. Buffer plate 762 is arranged to provide a reference dimension, e.g., height d, that may be used to ascertain whether height g has changed. First zones 762a and second zone 762b are substantially designed to be relatively insensitive to tipping and tilting of gap 770. Tip and tilt insensitivity may be achieved, in one embodiment, because the average distance between first zones 762a and reticle 766, and the average distance between second zone 762b and reticle 766 generally does not change with tip and tilt. As the average distances do not change significantly with tip and tilt, a flux reading will not change significantly with tip and tilt.

Figure 7C:
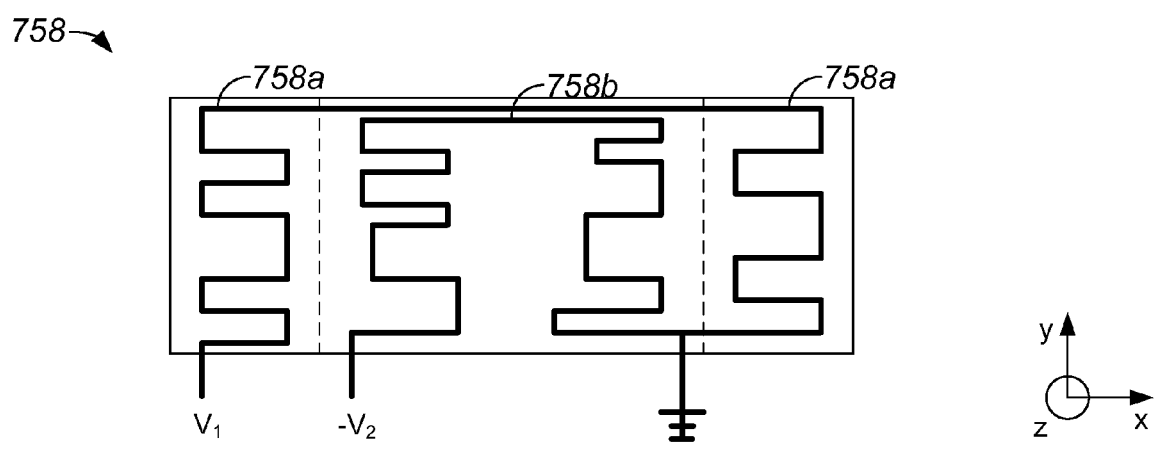
FIG. 7C is a diagrammatic bottom view representation of a flux sensor arrangement, e.g., flux sensor arrangement 758 of FIG. 7A, in accordance with an embodiment of the present invention.

FIG. 7C is a diagrammatic bottom view representation of a flux sensor arrangement, e.g., flux sensor arrangement 758 of FIG. 7A, in accordance with an embodiment of the present invention. When buffer plate 762 includes two zones, as shown in FIG. 7B, a flux sensor 758 may be a dual flux sensor that effectively covers first zones 758a and a second zone 758b, and is arranged t$_o$ output a first flux sensor voltage $V_1$ and a second flux sensor voltage $V_2$. First zones 758a may overlay first zones 762a of buffer plate 762 while second zone 758b may overlay second zone 762b of buffer plate 762. First voltage $V_1$ may correspond to a flux reading relating to first zones 762a of buffer plate 762 obtained while reticle 766 is being cooled using TEC 7$_5$0, while second flux sensor voltage $V_2$ may correspond to a flux reading relating to second zone 762b of buffer plate 762 obtained while reticle is being cooled using TEC 750.

Height g may be calculated using height d, which is generally known, and information relating to first voltage $V_1$ and second voltage $V_2$. Both first voltage $V_1$ and second voltage $V_2$ may vary as a function of time. In one embodiment, height g may be expressed as follows:

$$\frac{g+d}{g} = \int \frac{V_1(t)}{V_2(t)}$$

or as:

$$g = \frac{d}{\frac{\int V_1(t)}{\int V_2(t)} - 1}$$

As will be appreciated by those skilled in the art, if first voltage $V_1$ and second voltage $V_2$ are each plotted as a function of time, an initial slope associated with each plot may be expressed as $dV_1/dt$, or $dV_1$, and as $dV_2/dt$, or $dV_2$, respectively. The slopes associated with changes in voltage over time may be used to determine height g. Thus, in another embodiment, height g may also be expressed as follows:

$$\frac{g+d}{d} = \frac{dV_1}{dV_2}$$

or as:

$$g = \frac{d}{\frac{dV_1}{dV_2} - 1}$$

Figure 11:
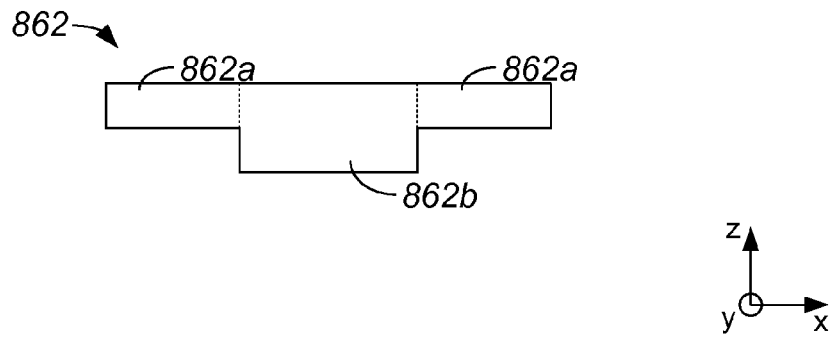
FIG. 11 is a diagrammatic side view representation of a zoned buffer plate that includes a central portion that extends past side portions in accordance with another embodiment of the present invention.

The configuration of a buffer plate such as buffer plate 762 of FIGS. 7A and 7B may vary. As shown, height d corresponds to an additional thickness of buffer plate 762 that is associated with first zone 762a. In one embodiment, an additional thickness may instead be associated with a second zone of a buffer plate rather than with a first zone of the buffer plate. FIG. 11 is a diagrammatic side view representation of a zoned buffer plate that includes a central portion that is offset such that the central portion extends past side portions in accordance with another embodiment of the present invention. A buffer plate 862 includes a plurality of first zones 862a and a second zone 862b where second zone 862b has a larger dimension relative to a z-axis than first zones 862a.

Figure 12:
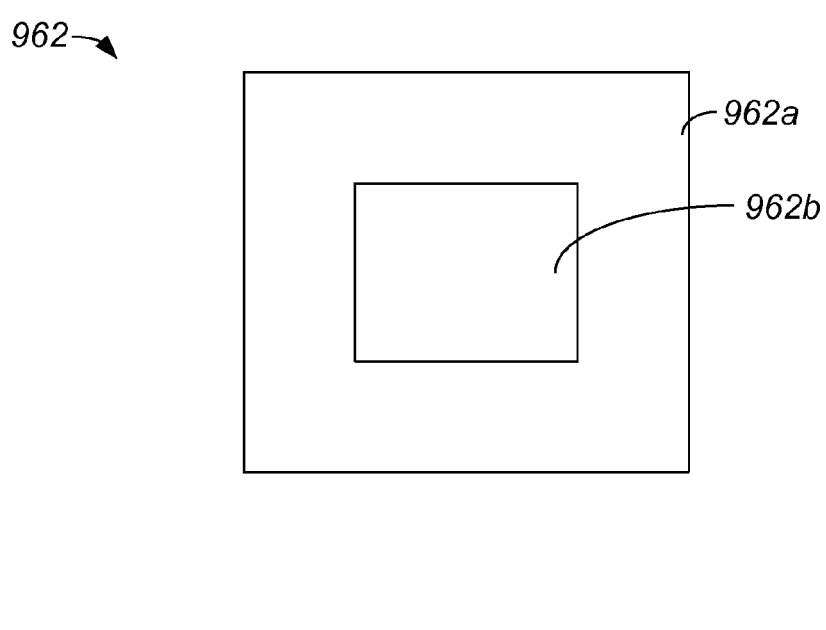
FIG. 12 is a diagrammatic bottom view representation of a zoned buffer plate in which a center portion is substantially surrounded by side portions in accordance with another embodiment of the present invention.

A buffer plate may be such that one zone is effectively surrounded by another zone. FIG. 12 is a diagrammatic bottom view representation of a zoned buffer plate in which a center portion is substantially surrounded by side portions in accordance with another embodiment of the present invention. A buffer plate 962 includes a first zone 962a and a second zone 962b. First zone 962a is arranged such that second zone 962b is effectively surrounded in an xy-plane by first zone 962a. Second zone 962b may either be recessed with respect to first zone 962a or protrude with respect to first zone 962b. It should be appreciated that a configuration of a flux sensor arrangement (not shown) that is suitable for use in cooperation with buffer plate 962 may differ from flux sensor arrangement 758 of FIGS. 7A and 7C.

Figure 13:
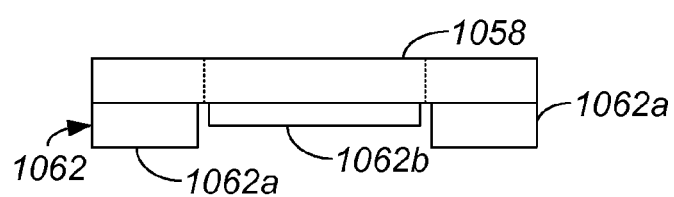
FIG. 13 is a diagrammatic side view representation of a zoned buffer plate arrangement that includes zones that are substantially separated from each other in accordance with an embodiment of the present invention.

In one embodiment, a buffer plate may be made of distinct plates that have offset exposed faces. The use of distinct plates that correspond to zones in lieu of a single, substantially continuous plate, reduces cross-talk between the zones, and may improve the precision with which a gap height may be determined. FIG. 13 is a diagrammatic side view representation of a flux sensor arrangement and a zoned buffer plate arrangement that includes zones that are associated with distinct plates in accordance with an embodiment of the present invention. A buffer plate arrangement 1062 is arranged to be coupled to a flux sensor arrangement 1058. Buffer plate arrangement includes a plurality of first zones 1062a that are separated from a second zone 1062b.

Figure 8:
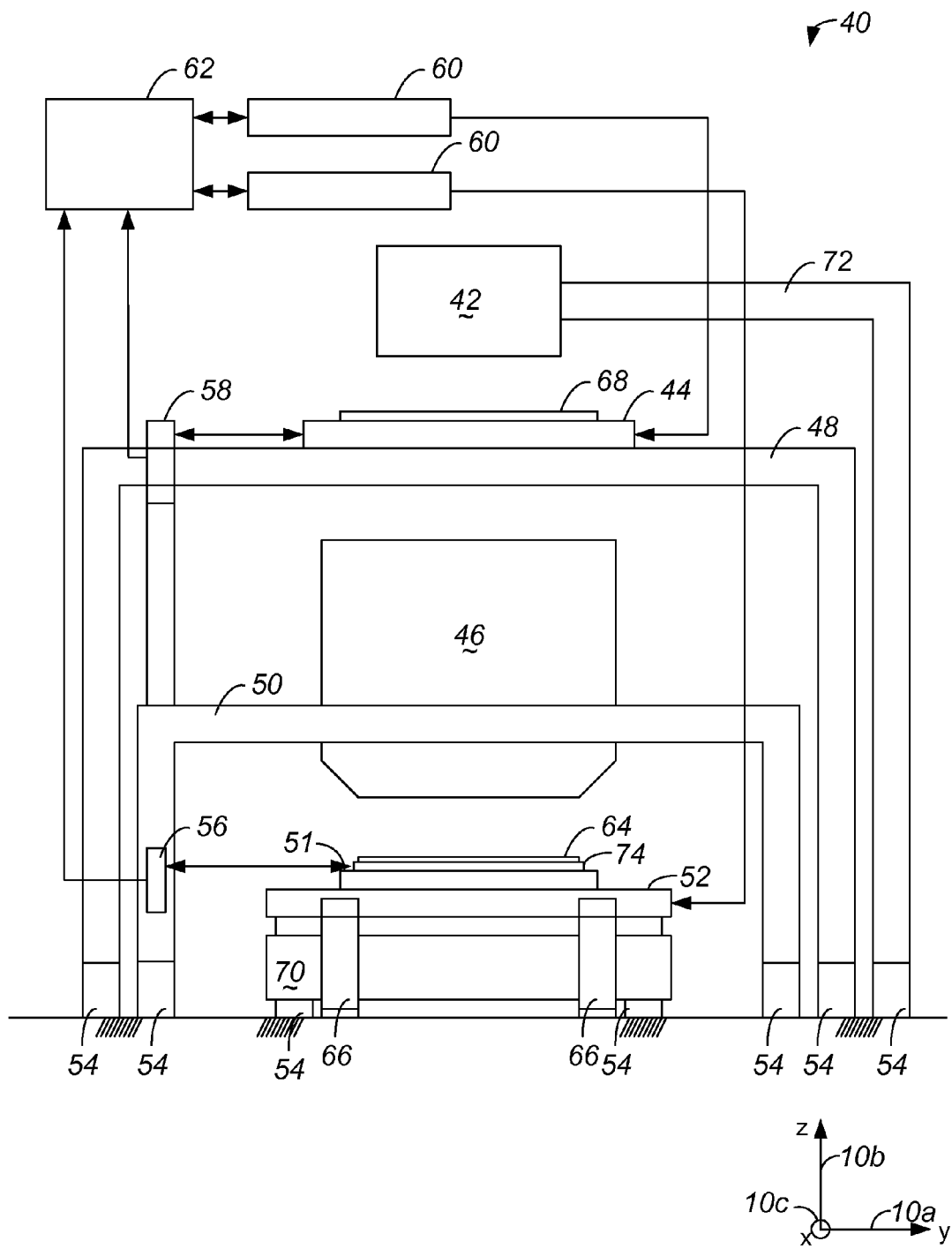
FIG. 8 is a diagrammatic representation of a photolithography apparatus in accordance with an embodiment of the present invention.

With reference to FIG. 8, a photolithography apparatus which may include a TEC array that has IR sensors interspersed with the TEC array, and/or may include a TEC with an associated flux sensor and zoned buffer plate, will be described in accordance with an embodiment. A photolithography apparatus (exposure apparatus) 40 includes a wafer positioning stage 52 that may be driven by a planar motor (not shown), as well as a wafer table 51. The planar motor which drives wafer positioning stage 52 generally uses an electromagnetic force generated by magnets and corresponding armature coils arranged in two dimensions.

A wafer 64 is held in place on a wafer holder or chuck 74 which is coupled to wafer table 51. Wafer positioning stage 52 is arranged to move in multiple degrees of freedom, e.g., in up to six degrees of freedom, under the control of a control unit 60 and a system controller 62. In one embodiment, wafer positioning stage 52 may include a plurality of actuators and have a configuration as described above. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In one described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties. In preferred embodiments, base 70 acts as a countermass absorbing the reaction force from the positioning stage 52.

An illumination system 42 is supported by a frame 72. Frame 72 is supported to the ground via isolators 54. Illumination system 42 includes an illumination source, which may provide a beam of light that may be reflected off of a reticle. In one embodiment, illumination system 42 may be arranged to project a radiant energy, e.g., light, through a mask pattern on a reticle 68 that is supported by and scanned using a reticle stage 44 which includes a coarse stage and a fine stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. A second interferometer 58 is supported on projection optical system 46, and detects the position of reticle stage 44 which supports a reticle 68. Interferometer 58 also outputs position information to system controller 62. In some embodiments additional interferometer or other sensors, such as position encoders, may be used to monitor the position of the wafer table 51 relative to the projection optics frame 50.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an F2-type laser (157 nm). Alternatively, illumination system 42 may also use charged particle beams such as x-ray and electron beams. For instance, in the case where an electron beam is used, thermionic emission type lanthanum hexaboride (LaB6) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser are used, glass materials such as quartz and fluorite that transmit far ultra-violet rays is preferably used. When either an F2-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

The present invention may be utilized, in one embodiment, in an immersion type exposure apparatus if suitable measures are taken to accommodate a fluid. For example, PCT patent application WO 99/49504, which is incorporated herein by reference in its entirety, describes an exposure apparatus in which a liquid is supplied to a space between a substrate (wafer) and a projection lens system during an exposure process. Aspects of PCT patent application WO 99/49504 may be used to accommodate fluid relative to the present invention.

Figure 9:
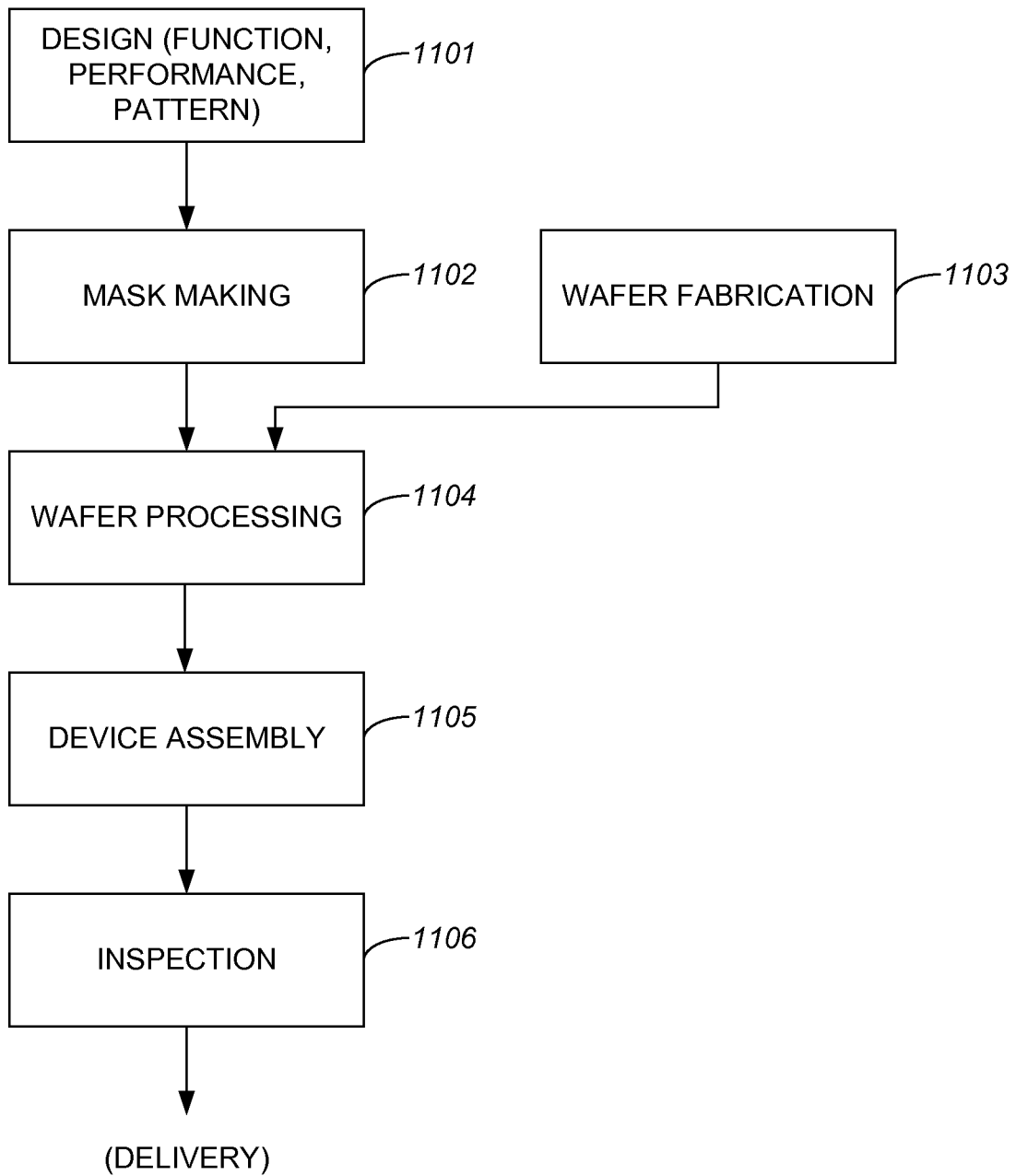
FIG. 9 is a process flow diagram which illustrates the steps associated with fabricating a semiconductor device in accordance with an embodiment of the present invention.

FIG. 9 is a process flow diagram which illustrates the steps associated with fabricating a semiconductor device in accordance with an embodiment of the present invention. A process of fabricating a semiconductor device begins at step 1101 in which the function and performance characteristics of a semiconductor device are designed or otherwise determined. Next, in step 1102, a reticle or mask in which has a pattern is designed based upon the design of the semiconductor device. It should be appreciated that in a substantially parallel step 1103, a wafer is typically made from a silicon material. In step 1104, the mask pattern designed in step 1102 is exposed onto the wafer fabricated in step 1103 through the use of a lithography system. One process of exposing a mask pattern onto a wafer will be described below with respect to FIG. 10. In step 1105, the semiconductor device is assembled. The assembly of the semiconductor device generally includes, but is not limited to including, wafer dicing processes, bonding processes, and packaging processes. Finally, the completed device is inspected in step 1106. Upon successful completion of the inspection in step 1106, the completed device may be considered to be ready for delivery.

Figure 10:
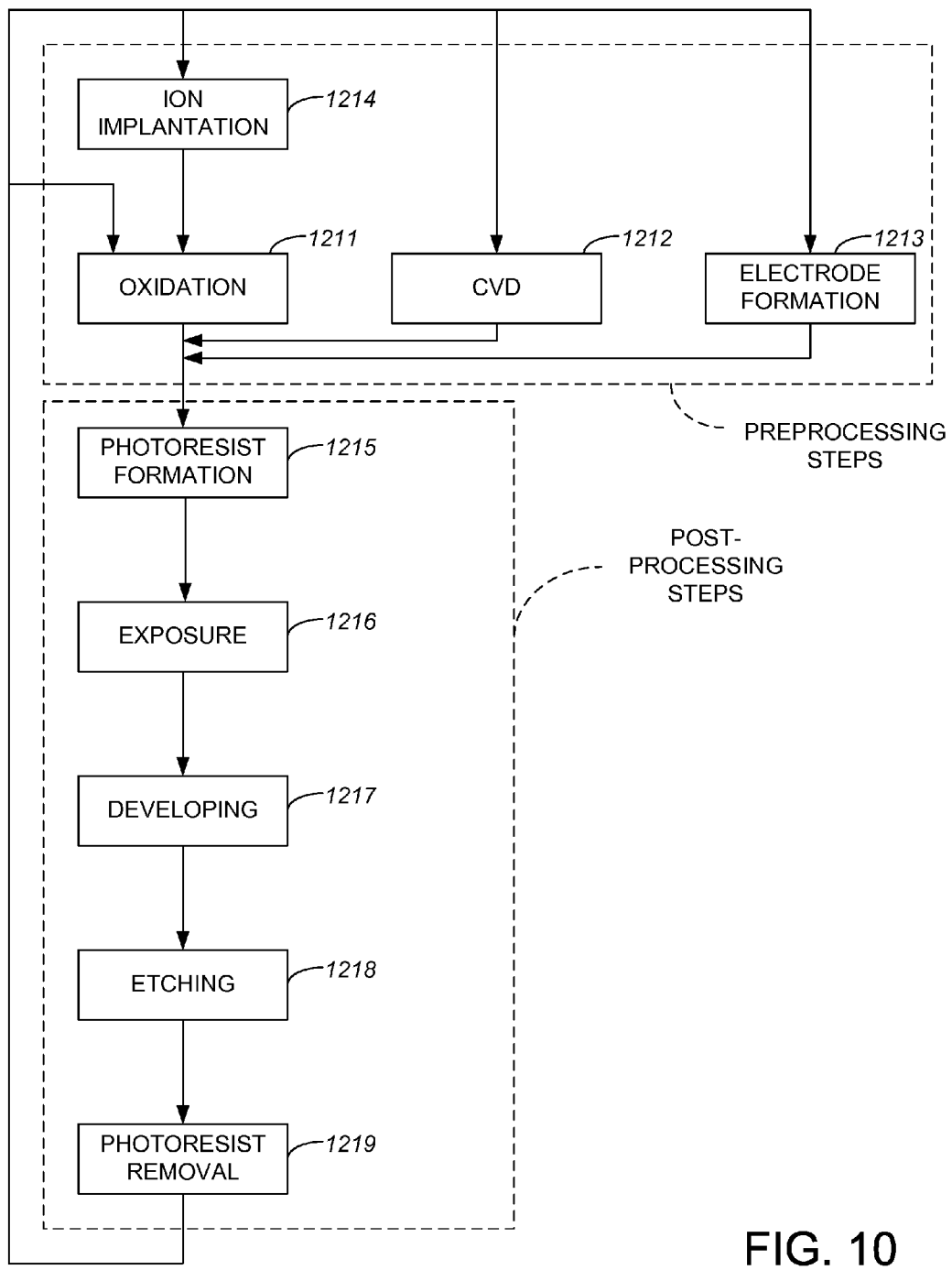
FIG. 10 is a process flow diagram which illustrates the steps associated with processing a wafer, i.e., step 1104 of FIG. 10, in accordance with an embodiment of the present invention.

FIG. 10 is a process flow diagram which illustrates the steps associated with wafer processing in the case of fabricating semiconductor devices in accordance with an embodiment of the present invention. In step 1211, the surface of a wafer is oxidized. Then, in step 1212 which is a chemical vapor deposition (CVD) step in one embodiment, an insulation film may be formed on the wafer surface. Once the insulation film is formed, then in step 1213, electrodes are formed on the wafer by vapor deposition. Then, ions may be implanted in the wafer using substantially any suitable method in step 1214. As will be appreciated by those skilled in the art, steps 1211-1214 are generally considered to be preprocessing steps for wafers during wafer processing. Further, it should be understood that selections made in each step, e.g., the concentration of various chemicals to use in forming an insulation film in step 1212, may be made based upon processing requirements.

At each stage of wafer processing, when preprocessing steps have been completed, post-processing steps may be implemented. During post-processing, initially, in step 1215, photoresist is applied to a wafer. Then, in step 1216, an exposure device may be used to transfer the circuit pattern of a reticle to a wafer.

After the circuit pattern on a reticle is transferred to a wafer, the exposed wafer is developed in step 1217. Once the exposed wafer is developed, parts other than residual photoresist, e.g., the exposed material surface, may be removed by etching in step 1218. Finally, in step 1219, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, while a TEC array has generally been described as including a plurality of TECs, a TEC array may be arranged to include components other than TECs. A TEC array may include a manifold arranged substantially around the TECs of the TEC array, and the manifold may include cooling channels.

The use of IR radiation sensing devices has been described in terms of a reticle cooling process. It should be appreciated that the use of IR radiation sensing devices may also be used in conjunction with a reticle heating process. Similarly, while a flux sensor arrangement and a buffer plate may be used during a reticle cooling process, a flux sensor arrangement and a buffer plate may also be used during a reticle heating process.

IR sensors have generally been described as either being substantially integrated with a TEC array or positioned along the periphery of a TEC array. It should be appreciated, however, that in one embodiment, IR sensors may be substantially integrated with a TEC array and positioned along the periphery of the TEC array. The IR sensors may also be positioned such that the faces of some IR sensors are in approximately the same plane as the faces of TECs in the array, while other IR sensors are positioned substantially behind the faces of the TECs without departing from the spirit or the scope of the present invention.

The size and the shape of a TEC may vary widely. In general, TECs may be approximately square or rectangular in shape. However, it should be appreciated that TECs are not limited to being approximately square or rectangular in shape. For example, TECs may be annularly shaped.

A zoned buffer plate has generally been described as including two zones, e.g., a first zone 762a and a second zone 762b as shown in FIG. 7B. The number of zones included in a zoned buffer plate may vary widely, however. For example, a buffer plate may include a single zone, or a buffer plate may include more than two zones without departing from the spirit or the scope of the present invention. When detecting at least one direction of tip or tilt is desired, additional zones may be added to a buffer plate where such additional zones are associated with different gap height differences.

Similarly, a flux sensor has been described as being a dual flux sensor. However, a flux sensor is not limited to being a dual flux sensor, e.g., one or more individual flux sensors may be used in lieu of a dual flux sensor.

In one embodiment, a buffer plate and a flux sensor may be packaged together. That is, a buffer plate topography and functional may be incorporated into packaging associated with a flux sensor.

It should be appreciated that cooling a reticle may generally involve both cool and heating a reticle. In other words, cooling a reticle generally refers to heat transfer with respect to the reticle, and the heat transfer may involve removing heat from the reticle and/or adding heat to the reticle.

It should be appreciated that some aspects of the present invention may be embodied as logic, e.g., hardware and/or software logic. By way of example, a cooling control module that uses information obtained from an IR radiation sensing arrangement such as a sensor or a camera may include logic. Hardware and/or software logic may be embodied in a tangible medium that, when executed, is operable to perform the various methods and processes associated with the embodiments. That is, the logic may be embodied as physical arrangements or components. A tangible medium may be substantially any computer-readable medium that is capable of storing logic or computer program code which may be executed, e.g., by a processor or an overall computing system, to perform methods and functions associated with the embodiments. Such computer-readable mediums may include, but are not limited to including, physical storage and/or memory devices. Executable logic may include, but is not limited to including, code devices, computer program code, and/or executable computer commands or instructions.

It should be appreciated that a computer-readable medium, or a machine-readable medium, may include transitory embodiments and/or non-transitory embodiments, e.g., signals or signals embodied in carrier waves. That is, a computer-readable medium may be associated with non-transitory tangible media and transitory propagating signals.

The operations associated with the various methods of the present invention may vary widely. Steps may be added, removed, altered, combined, and reordered without departing from the spirit or the scope of the present invention.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

The invention claimed is:

1. An apparatus comprising:
a first array, the first array being arranged over a surface and arranged to provide cooling to the surface, the first array including a plurality of thermoelectric chips (TECs), the surface being arranged to emit radiation;
at least a first sensing arrangement, the first sensing arrangement being substantially integrated with the first array, wherein the first sensing arrangement is arranged to make a non-contact measurement associated with the surface; and
a controller, the controller being arranged to obtain the non-contact measurement and to use the non-contact measurement to control the cooling provided by the first array.

2. The apparatus of claim 1 wherein the plurality of TECs arranged in the first array is arranged such that at least one space is defined by the plurality of TECs and wherein the at least first sensing arrangement is an infrared (IR) radiation sensing arrangement, the IR radiation sensing arrangement being arranged to detect the radiation when the radiation emanates from the surface to the at least one space.

3. The apparatus of claim 2 wherein the non-contact measurement includes information associated with the radiation detected by the IR radiation sensing arrangement, the controller further being arranged to use the information to control the cooling provided by the first array.

4. The apparatus of claim 3 wherein the surface is a surface of a reticle, and the IR radiation sensing arrangement includes at least one IR camera positioned above the first array.

5. The apparatus of claim 3 wherein the surface is a surface of a reticle, and the IR radiation sensing arrangement includes a plurality of IR sensors.

6. The apparatus of claim 5 wherein the at least one space defined by the plurality of TECs includes a plurality of spaces, and wherein each IR sensor of the plurality of IR sensors is arranged at least partially within a corresponding space of the plurality of spaces.

7. The apparatus of claim 1 wherein the first array is further arranged to provide heating to the surface.

8. The apparatus of claim 5 wherein the plurality of IR sensors is arranged as a second array.

9. The apparatus of claim 5 wherein each sensor of the plurality of IR sensors is configured to detect a temperature of a corresponding discrete area of the surface of the reticle.

10. The apparatus of claim 1 wherein the controller is arranged to obtain the information while the first array is cooling the surface.

11. The apparatus of claim 1 wherein the plurality of TECs includes a first TEC, and wherein the at least first sensing arrangement includes a flux sensor arrangement, the flux sensor arrangement being coupled to the first TEC,
a buffer plate, the buffer plate being arranged to be positioned such that a portion of the buffer plate is at a first distance over the surface, the buffer plate and the flux sensor arrangement being arranged to cooperate to determine the first distance, and
at least one temperature sensor, the at least one temperature sensor being embedded in the first TEC.

12. The apparatus of claim 11 wherein the buffer plate includes a first zone and a second zone, the first zone having a first dimension relative to a z-axis the second zone having a second dimension relative to the z-axis, the first dimension being greater than the second dimension by a first amount, and wherein the flux sensor arrangement is a dual flux sensor arrangement arranged to output a first voltage associated with the first zone and a second voltage associated with the second zone.

13. The apparatus of claim 12 wherein the first distance is determined using the first amount and information related to the first voltage and the second voltage.

14. The apparatus of claim 12 wherein the dual flux sensor arrangement is arranged to output the first voltage and the second voltage while the first TEC cools the surface, wherein the surface is associated with an underlying reticle.

15. The apparatus of claim 12 wherein the buffer plate includes a plurality of distinct plates, the distinct plates including a first distinct plate corresponding to the first zone and a second distinct plate corresponding to the second zone.

16. The apparatus of claim 13 wherein the non-contact measurement is determined using a sensed temperature measurement from the at least one temperature sensor, the first voltage, the second voltage, and the first distance, and wherein the non-contact measurement is used by the controller to control a temperature of the surface.

17. A method of cooling a reticle, the method comprising:
providing an amount of cooling to the reticle using a plurality of thermoelectric chips (TECs) positioned above the reticle;
obtaining a measurement associated with the reticle, wherein obtaining the measurement associated with the reticle includes obtaining the measurement while providing the amount of cooling to the reticle without contacting a surface of the reticle; and
adjusting the amount of cooling based on the measurement.

18. The method of claim 17 wherein the plurality of TECs are arranged in an array such that a first TEC of the plurality of TECs is separated from a second TEC of the plurality of TECs by a first space, wherein obtaining the measurement associated with the reticle includes sensing infrared (IR) radiation emitted from the reticle, wherein the IR radiation emitted from the reticle is sensed using an IR sensing arrangement configured to sense the IR radiation through the first space, and wherein adjusting the amount of cooling based on the measurement includes adjusting the amount of cooling based on the sensed IR radiation.

19. The method of claim 18 wherein the IR sensing arrangement is an IR radiation sensor having a sensing face, and wherein the first TEC has a cooling face in a cooling plane, the sensing face being approximately arranged in the cooling plane.

20. The method of claim 18 wherein the IR sensing arrangement is an IR sensing camera, the IR sensing camera being positioned above the array.

21. The method of claim 18 wherein sensing the IR radiation emitted from the reticle occurs while providing the amount of cooling to the reticle.

22. The method of claim 17 wherein the plurality of TECs includes a first TEC having an associated flux sensor arrangement and an associated buffer plate including a first zone and a second zone, the associated flux sensor arrangement including a flux sensor and a temperature sensor, and wherein obtaining the measurement associated with the reticle includes obtaining a temperature measurement using the flux sensor arrangement.

23. The method of claim 22 further including:
identifying a height associated with the buffer plate;
measuring a first voltage associated with the first zone, the first voltage being measured using the flux sensor arrangement;
measuring a second voltage associated with the second zone, the second voltage being determined using the flux sensor arrangement;
utilizing a sensed temperature associated with the temperature sensor; and
utilizing the height associated with the buffer plate, information associated with the first voltage, and information associated with the second voltage to calculate the height of the air gap, wherein obtaining the temperature measurement using the flux sensor arrangement includes obtaining the temperature measurement using at least knowledge of the height of the air gap.

24. The method of claim 23 wherein obtaining the temperature measurement using the flux sensor arrangement further includes using knowledge of the sensed temperature and at least one selected from a group including the first voltage and the second voltage.

25. The method of claim 24 wherein the height associated with the buffer plate is a difference between a height of the first zone and a height of the second zone.

26. The method of claim 24 further including:
cooling the reticle using the cooling arrangement, wherein the first voltage and the second voltage are measured while cooling the reticle.

27. The method of claim 23 wherein the first TEC includes at least one temperature sensor, and obtaining the measurement associated with the reticle includes sensing a temperature of the reticle using the at least one temperature sensor, and wherein adjusting the amount of cooling based on the measurement includes adjusting the amount of cooling based on the temperature of the reticle.

28. An apparatus comprising:
a first array, the first array being arranged over a surface and arranged to provide cooling to a surface, the first array including a plurality of thermoelectric chips (TECs), the plurality of TECs being arranged in the first array such that at least one space is defined by the plurality of TECs, wherein the surface emits radiation;
an infrared (IR) radiation sensing arrangement, the IR radiation sensing arrangement being arranged to detect the radiation when the radiation emanates from the surface to the at least one space; and
a controller, the controller being arranged to obtain information associated with the radiation detected by the IR radiation sensing arrangement, the controller further being arranged to use the information to control the cooling provided to the surface by the first array.

29. An apparatus comprising:

a first thermoelectric chip (TEC), the first TEC including a temperature sensor;

a flux sensor arrangement, the flux sensor arrangement being co-located with respect to the first TEC; and a buffer plate, the buffer plate being arranged to be positioned such that a portion of the buffer plate is at a first distance over an underlying reticle, the buffer plate and the flux sensor arrangement being arranged to cooperate to determine the first distance and to measure a temperature of the underlying reticle.

* * * * *